United States Patent
Groiss

(10) Patent No.: US 7,724,486 B2
(45) Date of Patent: May 25, 2010

(54) SENSING A CURRENT SIGNAL IN AN INTEGRATED CIRCUIT

(75) Inventor: Stefan Hermann Groiss, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 160 days.

(21) Appl. No.: 11/847,377

(22) Filed: Aug. 30, 2007

(65) Prior Publication Data

US 2009/0059450 A1    Mar. 5, 2009

(51) Int. Cl.
*H02H 3/22* (2006.01)
(52) U.S. Cl. .......................................... 361/56; 361/111
(58) Field of Classification Search ............. 361/56–58, 361/111

See application file for complete search history.

(56) References Cited

U.S. PATENT DOCUMENTS

| | | | |
|---|---|---|---|
| 4,048,584 A * | 9/1977 | Ulmer ......................... | 331/62 |
| 5,563,757 A | 10/1996 | Corsi | |
| 5,973,897 A * | 10/1999 | Opris et al. ................... | 361/56 |
| 6,556,408 B1 | 4/2003 | Zhang | |
| 2006/0056121 A1 | 3/2006 | Esmark et al. | |
| 2007/0091526 A1* | 4/2007 | Steinhoff et al. .............. | 361/56 |
| 2008/0100973 A1* | 5/2008 | Soldner et al. ................ | 361/56 |

FOREIGN PATENT DOCUMENTS

WO    2004/049536 A1    6/2004

* cited by examiner

*Primary Examiner*—Danny Nguyen
(74) *Attorney, Agent, or Firm*—Banner & Witcoff, Ltd.

(57) ABSTRACT

An integrated circuit including a voltage setting circuit configured to set the voltage level at a signal input to a value corresponding to a first supply voltage of the integrated circuit.

21 Claims, 4 Drawing Sheets

SENSING A CURRENT SIGNAL IN AN INTEGRATED CIRCUIT

BACKGROUND

Aspects of the present invention generally relate to sensing a current in an integrated circuit.

In some types of integrated circuits, it is necessary to sense a current signal, e.g. a sensor current. The sensor current may be generated in a sensor, e.g. a photo diode or the like, which is connected to a signal input of the integrated circuit or which is provided integrally within the integrated circuit. Typically the sensor current is received via a current input stage of the integrated circuit so as to be supplied to internal structures of the integrated circuit for further processing. For example, the sensor may be used as part of a data interface to receive data signals.

When sensing a current, in particular with very low sensor currents, leakage currents may exist which are the same order of magnitude as the sensor current.

BRIEF SUMMARY

According illustrative aspects of the invention, an integrated circuit may be provided with a voltage setting circuit configured to set the voltage level at a signal input to a value corresponding to a first supply voltage of the integrated circuit.

DETAILED DESCRIPTION

The following detailed description explains illustrative embodiments of the present invention. The description is not to be taken in a limiting sense, but is made only for the purpose of illustrating the general principles of the invention. It is to be understood that the scope of the invention is only defined by the claims and is not intended to be limited by the exemplary embodiments described hereinafter.

In the following detailed description of illustrative embodiments any shown or described direct connection or coupling between two functional blocks, devices, components, or other physical or functional units could also be implemented by an indirect connection or coupling.

The illustrative embodiments described hereinafter with respect to the accompanying drawings relate to integrated circuits provided with a current input stage for sensing a sensor current and to corresponding methods of sensing an input current. As illustrated by way of example, the sensor current may be generated by a photo diode. However, it is to be understood that the sensor current may be generated by other types of sensors as well. Further, it is to be understood that the sensor may be an internal component of the integrated circuit or may be an externally connected component. According to one illustrative embodiment, the integrated circuit may be configured for communication applications and the sensor current, in the following also referred to as input current, may represent data signals received by a data interface of a communication apparatus. In other applications, other types of sensors may be used and the sensor current may be associated with a different function. Further, the input current is not limited to a sensor current. In other illustrative embodiments of the invention, the input current may be a feedback signal of a control loop, e.g., for controlling a piezoelectric element, or the like.

Figure 1:
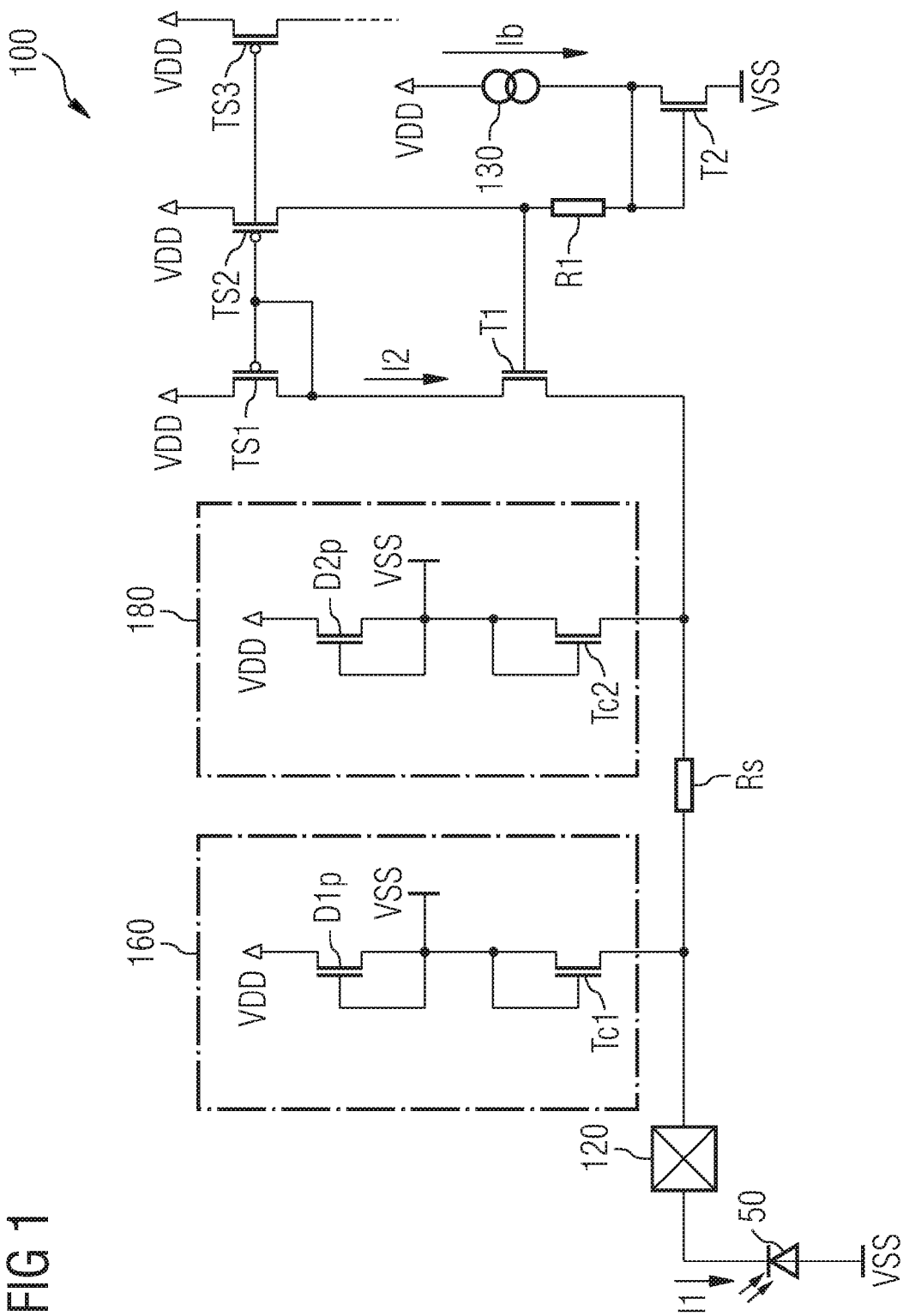
FIG. 1 schematically illustrates a current input stage of an integrated circuit according to an illustrative embodiment of the invention.

FIG. 1 schematically illustrates a current input stage 100 of an integrated circuit according to an illustrative embodiment of the invention. The current input stage 100 is coupled to a signal input 120 of the integrated circuit. The signal input 120 may correspond to an input pad, a connection pin or the like, and may also be referred to as a measuring node. As further illustrated, a photo diode 50 is coupled between the signal input 120 and a first supply voltage of the integrated circuit. In the illustrated embodiment, the first supply voltage corresponds to a low supply voltage VSS. In the current input stage, a first current path is formed from a second supply voltage, through the signal input 120 and the photo diode 50 to the first supply voltage. In the illustrated embodiment, the second supply voltage corresponds to a high supply voltage VDD. In other illustrative embodiments, the first and second supply voltages may be selected in a different manner.

Further coupled to the signal input is a first electrostatic discharge protection circuit (ESD protection circuit) 160. As further illustrated, a second ESD protection circuit 180 is coupled to the signal input 120 and to the first ESD protection circuit 160 via a series resistor Rs. The first ESD protection circuit 160 and the second ESD protection circuit 180 may also be referred to as a primary clamp and secondary clamp, respectively.

The first and second ESD protection circuits 160, 180 generally have a similar configuration and are coupled to the signal input, to the first supply voltage, and to the second supply voltage. According to the illustrated embodiment, the first and second ESD protection devices 160, 180 are suitable to provide protection with respect to an electrostatic discharge event (ESD event) between the signal input 120 and the first supply voltage, between the signal input 120 and the second supply voltage, and between the first supply voltage and the second supply voltage.

According to the illustrated embodiment, the internal structure of the first ESD protection circuit 160 is as follows: A first protection element D1$p$ and a second protection element Tc1 are coupled in series between the second supply voltage and the signal input 120. A node between the first protection element D1$p$ and the second protection element Tc1 is coupled to the first supply voltage. The first protection element D1$p$ and the second protection element Tc1 are formed as diodes. The diodes are each implemented on the basis of MOS transistor (MOS: Metal Oxide Semiconductor). The MOS transistor of the first protection element D1$p$ is of n-channel type and has a first terminal, i.e. its drain terminal, coupled to the second supply voltage and a second terminal, i.e. its source terminal, and a control terminal, i.e. its gate terminal, coupled to the first supply voltage. Accordingly, the MOS transistor of the first protection element D1$p$ forms an n-channel diode having its conducting direction from the first supply voltage to the second supply voltage. As in the illustrated embodiment the first supply voltage corresponds to the low supply voltage VSS and the second supply voltage corresponds to the high supply voltage VDD, the diode of the first protection element is non-conducting in normal operation of the integrated circuit.

The MOS transistor of the second protection element Tc1 is of n-channel type and has its drain and gate terminals coupled to the first supply voltage and its source terminal coupled to the signal input 120. Accordingly, the MOS transistor of the second protection element Tc1 forms an n-channel diode which has its conducting direction from the first supply voltage to the signal input 120. As in the illustrated embodiment the first supply voltage corresponds to the low supply voltage VSS, i.e. the lowest potential in the system, the diode of the second protection element Tc1 is non-conducting in normal operation of the integrated circuit.

The internal structure of the second ESD protection circuit 180 is similar to the first ESD protection circuit 160. A third protection element D2p and a fourth protection element Tc2 are coupled in series between the second supply voltage and the signal input 120. As already mentioned, the coupling to the signal input 120 is via the series resistor Rs. A node between the third protection element D2p and the fourth protection element Tc2 is coupled to the first supply voltage. The third protection element D2p and the fourth protection element Tc2 are formed as diodes, each implemented on the basis of an MOS transistor.

The MOS transistor of the third protection element D2p is of n-channel type and has its drain terminal coupled to the second supply voltage and its gate and source terminals coupled to the first supply voltage. Accordingly, the third protection element D2p corresponds to an n-channel diode having its conducting direction from the first supply voltage to the second supply voltage. The diode of the third protection element D2p is non-conducting in normal operation of the integrated circuit.

The MOS transistor of the fourth protection element Tc2 is of n-channel type and has its drain and gate terminals coupled to the first supply voltage and to the third protection element D2p, and its source terminal coupled to the signal input 120 via the series resistor Rs. Accordingly, the fourth protection element Tc2 corresponds to an n-channel diode having its conducting direction from the first supply voltage and the third protection element D2p to the signal input 120. The diode of the fourth protection element Tc2 is non-conducting in normal operation of the integrated circuit.

The operation of the first ESD protection circuit 160 in case of ESD events is as follows:

In case of an ESD event, i.e. an electrostatic discharge, from the signal input to the first supply voltage, the diode of the first protection element Tc1 breaks through and the discharge is dissipated from the signal input 120 toward the first supply voltage via the node between the first protection element D1p and the second protection element Tc1. In case of an electrostatic discharge from the first supply voltage toward the signal input 120, the electrostatic discharge is dissipated from the node between the first protection element D1p and the second protection element Tc1 toward the signal input 120 in the conducting direction of the diode of the second protection element Tc1.

In case of an electrostatic discharge from the signal input 120 toward the second supply voltage, the diode of the second protection element Tc1 breaks through, and the discharge is dissipated toward the second supply voltage via the first protection element D1p, in the conducting direction of the diode of the first protection element D1p. In case of an electrostatic discharge from the second supply voltage toward the signal input 120, the diode of the first protection element D1p breaks through, and the discharge is dissipated toward the signal input 120 via the second protection element Tc1, in the conducting direction of the second protection element Tc1.

In case of an electrostatic discharge from the second supply voltage toward the first supply voltage, the diode of the first protection element D1p breaks through, and the discharge is dissipated toward the first supply voltage. In case of an electrostatic discharge from the first supply voltage toward the second supply voltage, the discharge is dissipated toward the second supply voltage via the diode of the first protection element D1p, in the conducting direction of this diode.

The operation of the second ESD protection circuit 180 in case of an ESD event is similar to first ESD protection circuit 160. In particular, the third protection element D2p has a function similar to the first protection element D1p of the first ESD protection circuit 160, and the fourth protection element Tc2 has a function similar to the second protection element Tc1 of the first ESD protection circuit 160.

According to the illustrated embodiment, the current input stage further includes a voltage setting circuit configured to set the voltage level at the signal input 120 to a value which corresponds to the first supply voltage of the integrated circuit. In FIG. 1, the voltage setting circuit is illustrated on the right hand side of the circuit diagram.

As illustrated, the voltage setting circuit includes a first transistor T1 arranged in the first current path through the signal input 120 and the photo diode 50. A second current path is provided from the second supply voltage to the first supply voltage, and a resistor R1 is arranged in the second current path. A current mirror circuit is provided for mirroring the current in the first current path to the second current path.

According to the illustrated embodiment, the current mirror circuit includes a first mirror transistor TS1 arranged in the first current path and a second mirror transistor TS2 arranged in the second current path. As illustrated, the first mirror transistor TS1 and the second mirror transistor TS2 are each implemented as a p-channel MOS transistor, and the first mirror transistor TS1 has its gate terminal coupled to its drain terminal. The current mirror circuit further includes a third mirror transistor TS3 arranged in a third current path, which is implemented as a p-channel MOS transistor as well. The current mirror circuit is configured to mirror a current I2 through the first current path to the second current path and to the third current path. The third current path is used for passing the input current to other structures of the integrated circuit so as to be processed according to specific functions of the integrated circuit. In other illustrative embodiments, the current mirror circuit may be implemented in a different way, e.g. using other types of transistors.

According to the illustrated embodiment, the above-mentioned first transistor T1 is implemented as an n-channel MOS transistor. A control terminal of the first transistor T1, i.e. the gate terminal, is coupled to a node between the second supply voltage and the resistor in the second current path. Accordingly, a control voltage of the first transistor T1 is generated according to a voltage drop over the resistor R1 due to the mirrored current in the second current path.

As further illustrated, the voltage setting circuit includes a diode coupled between the resistor R1 of the second current path and the first supply voltage. The diode is implemented by a second transistor T2, in the illustrated embodiment an n-channel MOS transistor having its drain and gate terminals coupled to each other. Accordingly, the diode has its conducting direction from the resistor R1 toward the first supply voltage. In addition, a bias current source 130 is coupled to a node between the resistor R1 and the diode, i.e. to the drain terminal of the second transistor T2, so as to supply a bias current Ib through the diode. The bias current Ib may be used to adjust the voltage level generated at the control terminal of the first transistor T1.

In other illustrated embodiments, the voltage setting circuit may be implemented in a different way. For example, the voltage setting circuit could be implemented without the bias current source 130 and the second transistor T2. In this case, the voltage level at the control terminal of the first transistor T1 could be adjusted by the resistor R1.

The operation of the voltage setting circuit according to the illustrated embodiment is as follows: The control voltage of the first transistor T1 is adjusted in such a way that the source terminal of the first transistor T1, which is coupled to the signal input 120, is at a voltage level which corresponds to the first supply voltage. This is accomplished by the resistor R1 and the second transistor T2, which is operated as a diode. If the input current, i.e. the current through the first current path, is below a threshold value, e.g. below 1 nA, the voltage drop across the resistor R1 in the second current path is close to zero. Accordingly, the first transistor T1 operates in a below-threshold regime, i.e. in its non-conducting state, in which only a small current, below the above-mentioned threshold value, may flow through the first transistor T1. In this non-conducting state of the first transistor T1, the source terminal of the first transistor T1 is at a voltage level which corresponds to the first supply voltage of the integrated circuit.

In case of larger input currents, the control voltage of the first transistor T1 increases so as to bring the first transistor T1 into its conducting state, i.e. the gate voltage of a first transistor T1 is increased above the inversion threshold. In this case, larger currents are allowed to flow through the first current path. The voltage level at the source terminal of the first transistor T1 no longer corresponds to the first supply voltage. Although in this case leakage currents may be present in the circuit, their contribution is negligible as they are small as compared to the input current.

As described above, the voltage setting circuit thus operates so as to set the voltage level at the signal input 120 to a value corresponding to the first supply voltage if the input current received via the signal input 120 is below a threshold value.

The effect of the above-mentioned setting circuit is the following:

Generally, leakage currents may be present in the current input stage. For example, a leakage current could flow through the photo diode 50, in addition to the sensor current. Further, leakage currents could be present in the first ESD protection circuit 160 or in the second ESD protection circuit 180. However, according to the illustrated embodiment, as the voltage level at the signal input 120 is set so as to correspond to the first supply voltage of the integrated circuit leakage currents are significantly reduced or even completely eliminated. A leakage current through the photo diode 50 may be substantially eliminated, as there is no voltage drop across the photo diode 50. Further, as the voltage level at the signal input 120 corresponds to the first supply voltage and thus is equal to the voltage level in the node between the first protection element D1p and the second protection element Tc1 of the first ESD protection circuit and is also equal to the voltage level in the node between the third protection element D2p and the fourth protection element Tc2 of the second ESD protection circuit 180, in normal operation of the integrated circuit, there is no leakage current contribution to the first current path coming through the second protection element Tc1 or through the fourth protection element Tc2. Consequently, leakage currents are significantly reduced in the current input stage according to the illustrated embodiment, so that a current I1 through the photo diode 50 is substantially equal (e.g., equal) to a current I2 through the first current path. Accordingly, low sensor currents can be detected with high sensitivity.

Figure 2:
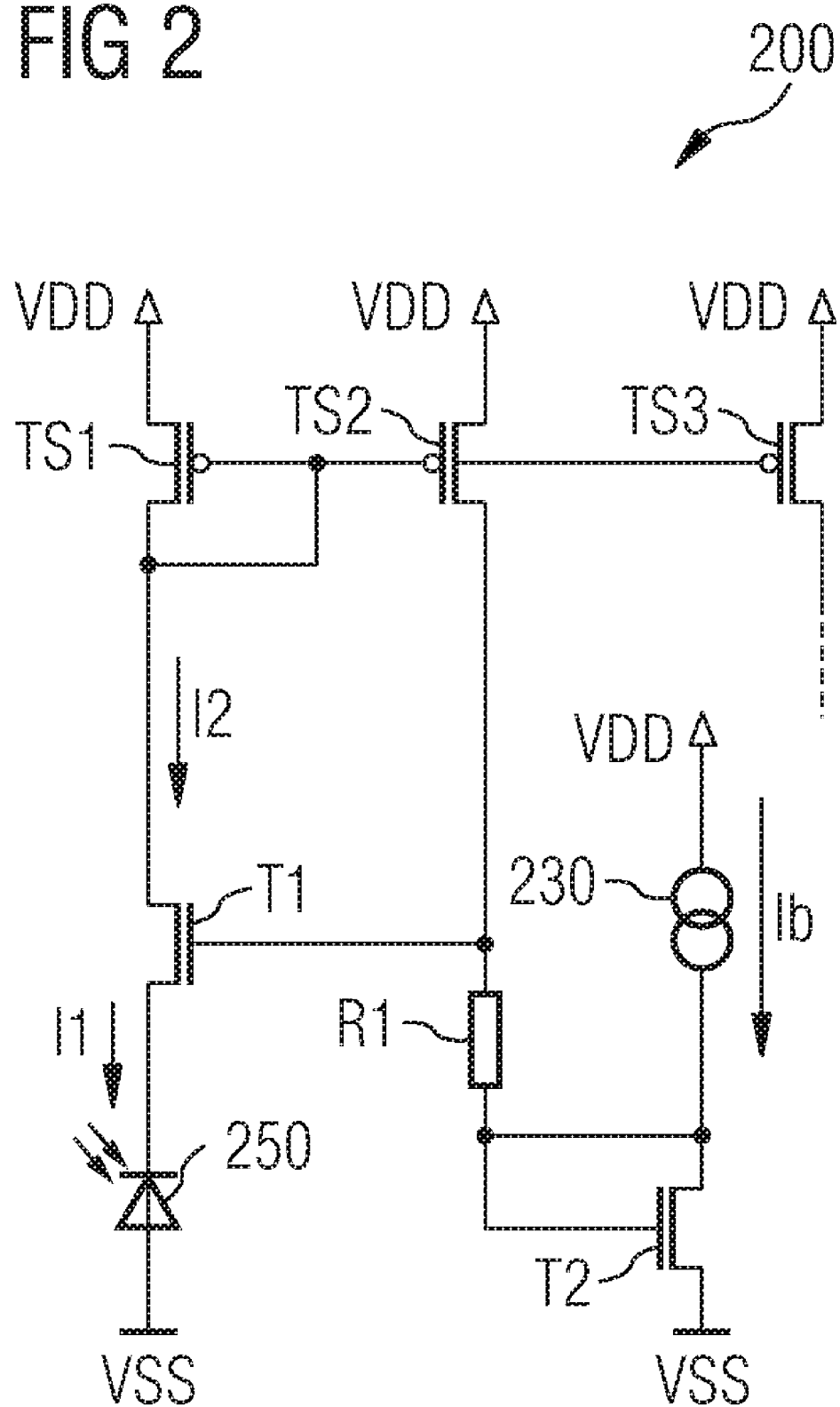
FIG. 2 schematically illustrates a current input stage of an integrated circuit according to a further illustrative embodiment of the invention.

FIG. 2 schematically illustrates a current input stage 200 of an integrated circuit according to a further illustrative embodiment of the invention. The current input stage 200 has a similar configuration as the current input stage 100 of FIG. 1. In FIG. 2, components corresponding to those of FIG. 1 have been designated with the same reference signs and will not be further described in the following. In particular, the current input stage 200 of FIG. 2 includes a first transistor T1, a resistor R1, a second transistor T2, and current mirror transistors TS1, TS2, TS3 which correspond to the respective designated components of FIG. 1. Further, a bias current source 230 is provided which corresponds to the bias current source 130 of FIG. 1.

However, as compared to the illustrative embodiment of FIG. 1, the integrated circuit according to FIG. 2 includes a monolithically integrated sensor. In the illustrated embodiment, the monolithically integrated sensor is a photo diode 250. Again, the first current path extends from the second supply voltage through the first transistor T1 and the photo diode 250 to the first supply voltage. As the first current path does not extend through an external signal input, no ESD protection circuits are provided.

As illustrated in FIG. 2, the monolithically integrated sensor, i.e. the photo diode 250, has a first terminal coupled to the first supply voltage of the integrated circuit and a second terminal coupled to the voltage setting circuit of the current input stage. The second terminal forms the connection between the sensor and the current input stage and may also be referred to as a measuring node. The voltage setting circuit operates as explained in connection with the illustrative embodiment of FIG. 1. In particular, the voltage setting circuit is configured to set the voltage level at the second terminal of the photo diode 250 to a value corresponding to the first supply voltage if a current in the first current path, through the first and second terminals of the sensor, is below a threshold value. Accordingly, a leakage current through the monolithically integrated sensor is reduced. At larger values of the sensor current, leakage currents may be present, but their contribution to the sensed current can be neglected.

Figure 3:
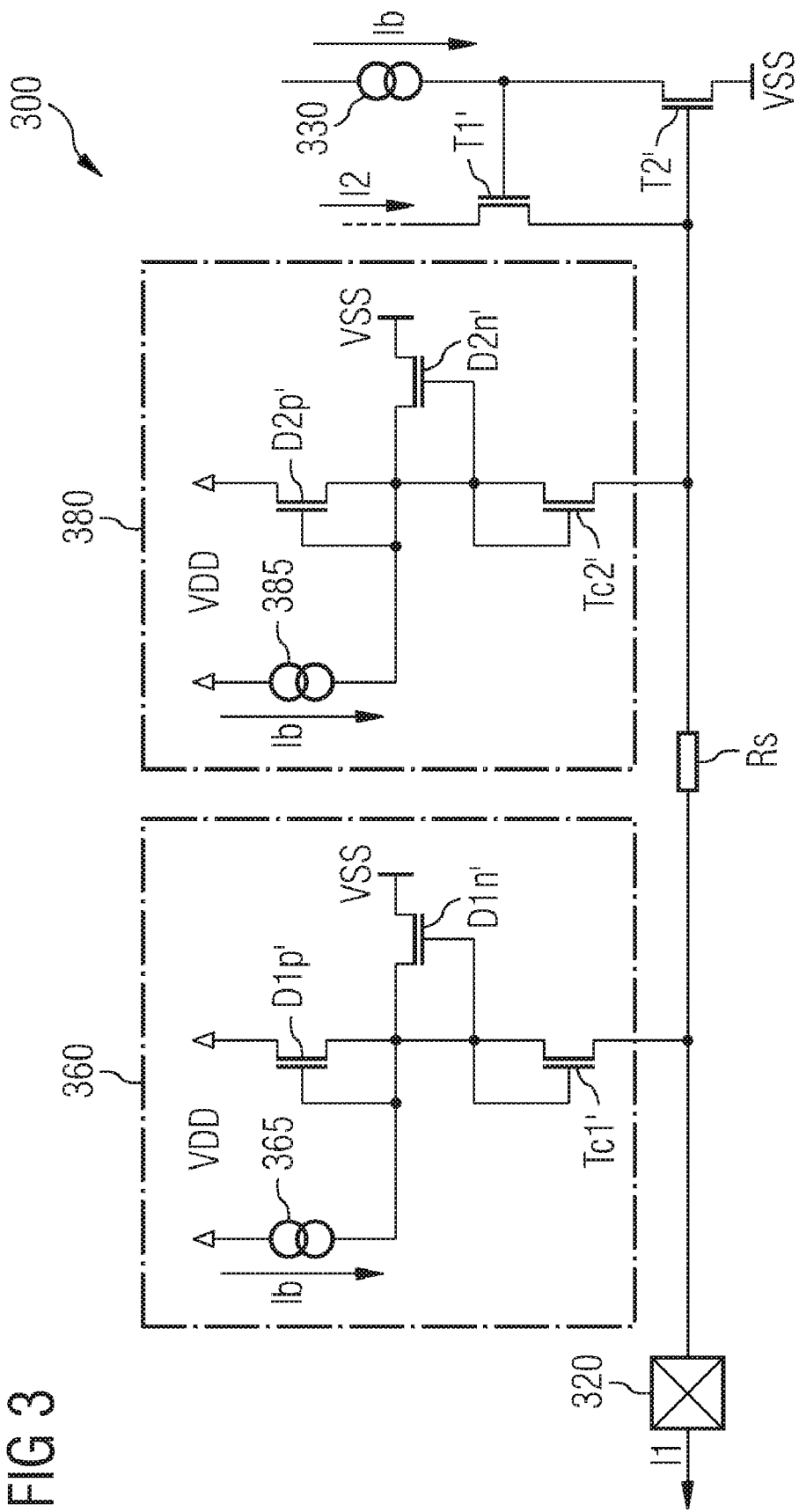
FIG. 3 schematically illustrates a current input stage of an integrated circuit according to a further illustrative embodiment of the invention.

FIG. 3 schematically illustrates a current input stage 300 in an integrated circuit according to a further illustrative embodiment of the invention. The current input stage 300 is coupled to a signal input 320 of the integrated circuit so as to receive an input current, e.g. a sensor current. Within the current input stage, a current path extends through a first transistor T1' and through the signal input 320. The signal input 320 may be used to couple a sensor, e.g. a photo diode, to the integrated circuit. The sensor may be coupled between the signal input 320 and a first supply voltage of the integrated circuit. In FIG. 3, a current through the first transistor T1' is designated by I2, and the sensor current is designated by I1. Generally, it is desirable to have a close correspondence between the sensor current T1 and the current I2. Via the current I2, the received input current is passed to internal structures of the integrated circuit for further processing. Again, the integrated circuit may be a part of a communication apparatus, and the sensor may be used for receiving a data signal.

As further illustrated, the current input stage includes a second transistor T2'. The second transistor T2' is implemented as an n-channel MOS transistor. The source terminal of the second transistor T2' is coupled to the first supply voltage of the integrated circuit. A control terminal of the second transistor T2', i.e. its gate terminal, is coupled to the signal input 320, via a series resistor Rs, and the drain terminal of the second transistor T2' is coupled to a current source 330, which supplies a bias current IB through the second transistor T2'. Further, the drain terminal of the second transistor T2' is coupled to a control terminal, i.e. the gate terminal, of the first transistor T1'. In the current input stage 300, the first transistor T1' has the function of a cascode transistor, and the second transistor T2' has the function of a bias transistor. A working point of the current input stage may be adjusted using the bias current Ib. That is to say, a potential at the control terminal of the bias transistor T2 may be adjusted by the bias current Ib.

As further illustrated, the current input stage 300 includes a first ESD protection circuit 360 coupled to the signal input 320, to the first supply voltage of the integrated circuit, and to a second supply voltage of the integrated circuit. Further, a second ESD protection circuit 380 is provided, which is coupled to the signal input 320 and the first ESD protection circuit 360 via a series resistor Rs, to the first supply voltage of the integrated circuit, and to the second supply voltage of the integrated circuit. The first and second ESD protection circuits 360, 380 are configured to provide protection with respect to ESD events between the signal input 320 and the first supply voltage, between the signal input 320 and the second supply voltage, and between the first supply voltage and the second supply voltage. The first ESD protection circuit 360 and the second ESD protection circuit 380 may also be referred to as a primary clamp and secondary clamp, respectively.

In the illustrated embodiment, the first supply voltage of the integrated circuit corresponds to a low supply voltage VSS, and the second supply voltage corresponds to a high supply voltage VDD. In other illustrative embodiments, the first and second supply voltages may be selected in a different manner.

The internal structure of the first ESD protection circuit 360 is as follows:

A first protection element D1p' and a second protection element Tc1' are coupled in series between the second supply voltage and the signal input 320. A first voltage setting circuit is coupled to a node between the first protection element D1p' and the second protection element Tc1'. The first voltage setting circuit is configured to set a voltage level in the node between the first protection element D1p' and the second protection element Tc1' to a value corresponding to a voltage level at the signal input 320.

In the illustrated embodiment, the first voltage setting circuit includes a first current source 365 and a first voltage setting diode D1n' coupled with one terminal to the node between the first protection element D1p' and the second protection element Tc1', and coupled with a second terminal to the first supply voltage. As illustrated, the first voltage setting diode D1n' is formed by an n-channel MOS transistor having its drain and gate terminals coupled to each other and having its source terminal coupled to the first supply voltage. Accordingly, the first voltage setting diode D1n' corresponds to an n-channel diode having its conduction direction from the node between the first protection element D1p' and the second protection element Tc1' toward the first supply voltage. The first current source 365 is coupled to the node between the first protection element D1p' and the second protection element Tc1' and supplies a first current through the voltage setting diode D1n'.

According to the illustrated embodiment, the first protection element D1p' is implemented by an n-channel MOS transistor having its drain terminal coupled to the second supply voltage and having its gate and source terminals coupled to each other and to the node between the first protection element D1p' and the second protection element Tc1'. Accordingly, the first protection element D1p' forms an n-channel diode having its conducting direction from the node between the first protection element D1p' and the second protection element Tc1' toward the second supply voltage. The second protection element Tc1' is implemented by an n-channel MOS transistor having its drain and gate terminals coupled to each other and to the node between the first protection element D1p' and the second protection element Tc1' and having its source terminal coupled to the signal input 320. Accordingly, the second protection element Tc1' corresponds to an n-channel diode having its conducting direction from the node between the first protection element D1p' and the second protection element Tc1' toward the signal input 320.

According to the illustrated embodiment, the first voltage setting diode D1n' is sized so as to substantially correspond to the bias transistor T2' of the current input stage. Further, the first current source 365 of the voltage setting circuit is configured to provide the first current through the first voltage setting diode D1n' substantially equal (e.g., equal) to the bias current Ib provided by the bias current source 330 of the current input stage.

According to the above-mentioned configuration of the first voltage setting circuit, the first voltage setting diode D1n' has similar dimensions as the bias transistor T2' and has a similar current flowing through it as the bias transistor T2'. Accordingly, a voltage level generated at the drain terminal of the MOS transistor of the first voltage setting diode D1n' corresponds to the voltage level generated at the gate terminal of the bias transistor T2', i.e. to the voltage level at the signal input 320. Accordingly, the voltage level in the node between the first protection element D1p' and the second protection element Tc1' of the first ESD protection circuit 360 is set so as to correspond to the voltage level at the signal input 320.

The second ESD protection circuit 380 has a similar configuration as the first ESD protection circuit 360. In particular, the second ESD protection circuit 380 includes a third protection element D2p' and a fourth protection element Tc2' which are coupled in series between the second supply voltage and the signal input 320. As mentioned above, the coupling to the signal input 320 is via the series resistor Rs. The third protection element D2p' is implemented by an n-channel MOS transistor having its drain terminal coupled to the second supply voltage and having its gate and source terminals coupled to a node between the third protection element D2p' and the fourth protection element Tc2'. Accordingly, the third protection element D2p' corresponds to an n-channel diode having its conducting direction from the node between the third protection element D2p' and the fourth protection element Tc2' toward the second supply voltage.

The fourth protection element is implemented by an n-channel MOS transistor having its drain and gate terminals coupled to the node between the third protection element D2p' and the fourth protection element Tc2' and having its source terminal coupled to the signal input via the series resistor Rs. Accordingly, the fourth protection element Tc2' corresponds to an n-channel diode having its conducting direction from the node between the third protection element D2p' and the fourth protection element Tc2' toward the signal input 320.

As further illustrated, the second ESD protection circuit 380 includes a second voltage setting circuit coupled to the node between the third protection element D2p' and the fourth protection element Tc2'. The second voltage setting circuit is configured to set a voltage level in the node between the third protection element and the fourth protection element to a value corresponding to the voltage level at the signal input 320.

According to the illustrated embodiment, the second voltage setting circuit includes a second voltage setting diode D2n' coupled with a first terminal to the node between the third protection element D2p' and the fourth protection element Tc2' and with a second terminal to the first supply voltage, and a second current source 385 coupled to the node between the third protection element D2p' and the fourth protection element Tc2' and configured to supply a second current through the second voltage setting diode D2n'.

As in the first voltage setting circuit, the second voltage setting diode D2n' is sized so as to correspond to the bias transistor T2' of the current input stage, and the second current source 385 is configured to supply the second current through the second voltage setting diode D2n' substantially equal (e.g., equal) to the bias current Ib. Accordingly, as the second voltage setting diode D2n' has similar dimensions as the bias transistor T2' and has a similar current flowing through it, the voltage level generated at the drain terminal of the MOS transistor of the voltage setting diode D2n' corresponds to the voltage level generated at the control terminal of the bias transistor T2'.

The second voltage setting diode D2n' is implemented by an n-channel MOS transistor having its drain and gate terminals coupled to the node between the third protection element D2p' and the fourth protection element Tc2', and having its source terminal coupled to the first supply voltage. Accordingly, the second voltage setting diode D2n' corresponds to an n-channel diode having its conducting direction from the node between the third protection element D2p' and fourth protection element Tc2' toward the first supply voltage.

Due to the first voltage setting circuit and the second voltage setting circuit in the first ESD protection circuit 360 and the second ESD protection circuit 380, a voltage level at the node between the first protection element D1p' and the second protection element Tc1' of the first ESD protection circuit 360, and a voltage level in the node between the third protection element D2p' and the fourth protection element Tc2' of the second ESD protection circuit 380 are set to a value which corresponds to the voltage level at the signal input 320. Accordingly, contributions of leakage currents across the second protection element Tc1' of the first ESD protection circuit 360 and across the fourth protection element Tc2' of the second ESD protection circuit 380 are significantly reduced or even completely eliminated. At the same time, the first voltage setting circuit and the second voltage setting circuit have a simple configuration.

The operation of the first and second ESD protection circuits 360, 380 in case of an ESD event is as follows:

In case of an electrostatic discharge between the signal input 320 and the first supply voltage, the voltage drop across the second protection element Tc1 in the first ESD protection circuit 360 and across the fourth protection element Tc2' in the second ESD protection circuit 380 increases until a controlled breakthrough occurs. At the same time, a discharge current flows via the second protection element Tc1' and the fourth protection element Tc2' and via the voltage setting diodes D1n' and D2n' toward the first supply voltage, in the conducting direction of the first voltage setting diode D1n' and the second voltage setting diode D2n'. In case of an electrostatic discharge from the first supply voltage toward the signal input 320, the discharge current flows from the first supply voltage via a p-well-drain diode of the MOS transistor of the first voltage setting diode D1n' and of the second voltage setting diode D2n' and via the second protection element Tc1' and the fourth protection element Tc2' toward the signal input 320, in the conducting direction of the n-channel diode of the second protection element Tc1' and of the fourth protection element Tc2'.

In case of an electrostatic discharge from the signal input 320 toward the second supply voltage, a breakdown of the n-channel diodes of the second protection element Tc1' and of the fourth protection element Tc2' occurs, and the discharge current flows via these diodes and the first protection element D1p' and the third protection element D2p' toward the second supply voltage, in the conducting direction of the diodes of the first protection element D1p' and of the third protection element D2p'. In case of an electrostatic discharge from the second supply voltage toward the signal input 320, a breakdown of the n-channel diodes of the first protection element D1p' and of the third protection element D2p' occurs, and the discharge current flows via these diodes and via the second protection element Tc1' and the fourth protection element Tc2' toward the signal input, in the conducting direction of the n-channel diodes of the second protection element Tc1' and of the fourth protection element Tc2'.

In case of an electrostatic discharge from the second supply voltage toward the first supply voltage, a breakdown of the n-channel diodes of the first protection element D1p' and of the third protection element D2p' occurs, and the discharge current flows via these diodes and via the first and second voltage setting diodes D1n', D2n' toward the first supply voltage, in the conducting direction of the n-channel diodes of the first and second voltage setting diodes D1n', D2n'. In case of an electrostatic discharge from the first supply voltage toward the second supply voltage, the discharge current flows via a p-well-drain diode of the MOS transistor of the first and second voltage setting diode D1n', D2n' and via the first protection element D1p' and the third protection element D2p' toward the second supply voltage. According to an illustrative embodiment, the p-wells of the MOS transistors of the first protection element D1p' and of the third protection element D2p' may be coupled to the source terminal of the respective MOS transistor. In this case, the discharge current flows via the p-well-drain diode of the MOS transistor of the first protection element D1p' and of the third protection element D2p'.

Figure 4:
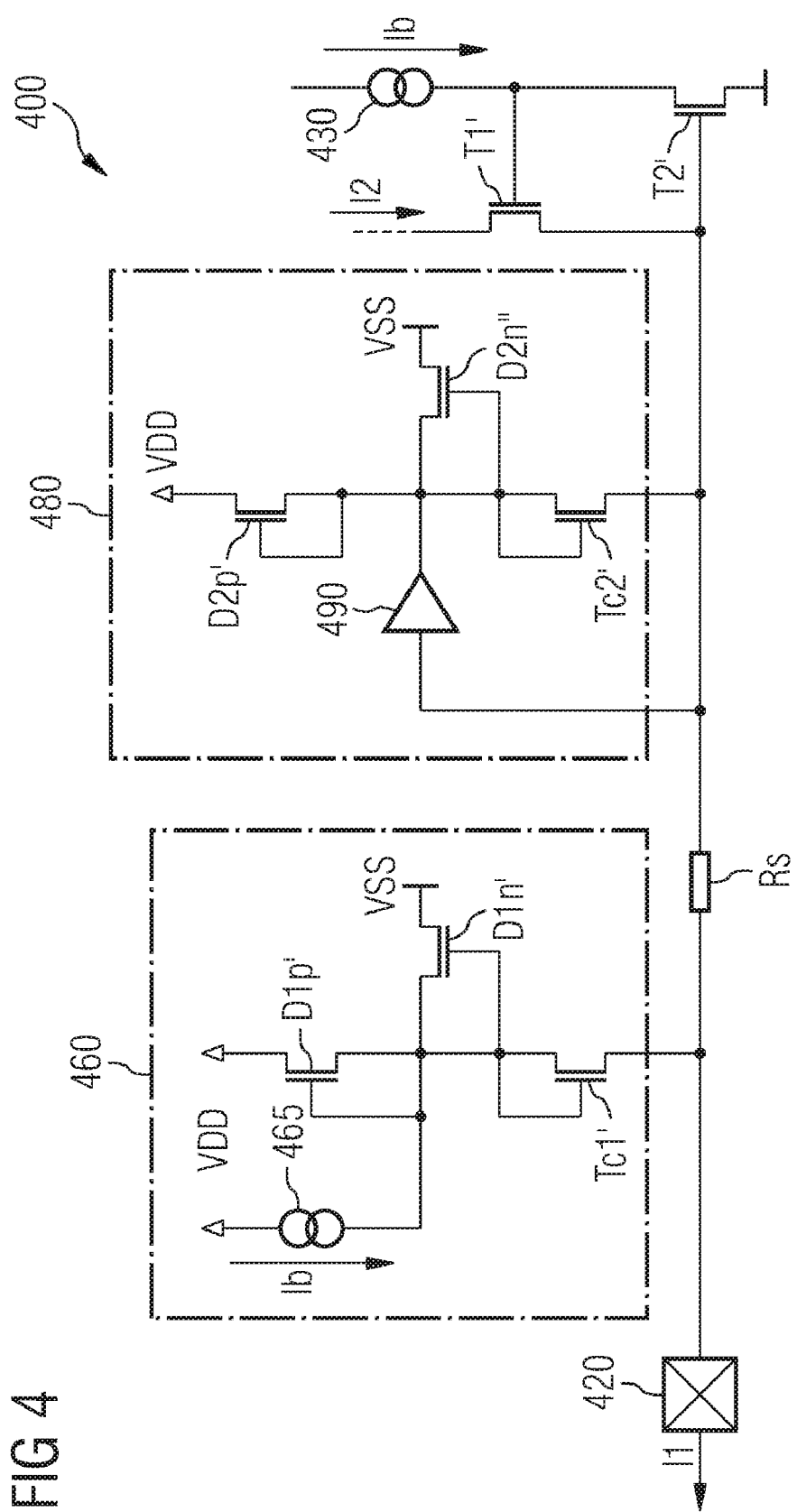
FIG. 4 schematically illustrates a current input stage of an integrated circuit according to a further illustrative embodiment of the invention.

FIG. 4 schematically illustrates a current input stage 400 in an integrated circuit according to a further illustrative embodiment of the invention. The current input stage 400 of FIG. 4 generally corresponds to that of FIG. 3, and similar components have been designated with the same reference signs. In particular, the current input stage of FIG. 4 includes a first transistor T1', a second transistor T2' which corresponds to the correspondingly designated components of FIG. 3. Further, the current input stage 400 of FIG. 4 includes a current source 430, which corresponds to the current source 330 of FIG. 3, and a first ESD protection circuit 460 which corresponds to the first ESD protection circuit 460 of FIG. 3. In the first ESD protection circuit 460, a first current source 465 is provided which corresponds to the first current source 365 in the first ESD protection circuit 360 of FIG. 3. The first ESD protection circuit 460 operates as explained in connection with the first ESD protection circuit 360 of FIG. 3.

According to the illustrative embodiment of FIG. 4, the current input stage 400 includes a second ESD protection circuit 480 which is coupled to the signal input 420 and to the first ESD protection circuit 460 via a series resistor Rs. The second ESD protection circuit 480 is further coupled to the first supply voltage and to the second supply voltage, and is configured to provide protection with respect to ESD events between the signal input 420 and the first supply voltage, between the signal input 420 and the second supply voltage, and between the first supply voltage and the second supply voltage.

The internal structure of the second ESD protection circuit 480 is as follows:

A third protection element D2p' and a fourth protection element Tc2' are coupled in series between the second supply voltage and the signal input 420. As mentioned above, the coupling with respect to the signal input 420 is via the series resistor Rs. The third protection element D2p' and the fourth protection element Tc2' correspond to the third protection element D2p' and the fourth protection element Tc2' of FIG. 3.

The second ESD protection circuit 480 further includes a second voltage setting circuit which is coupled to the node between the third protection element D2p' and the fourth protection element Tc2'. The second voltage setting circuit includes a buffer 490 coupled with its input to the signal input 420 and with its output to the node between the third protection element D2p' and the fourth protection element Tc2'. The buffer 490 is configured to set the voltage level in the node between the third protection element D2p' and the fourth protection element Tc2' to a value which corresponds to a voltage level at the signal input.

In addition, the second ESD protection circuit 480 includes a fifth protection element D2n'', which is coupled with a first terminal to the node between the third protection element D2p' and the fourth protection element Tc2', and is coupled with a second terminal to the first supply voltage. The fifth protection element D2n'' is implemented as a diode, by an n-channel MOS transistor having its drain and gate terminals coupled to the node between the third protection element D2p' and the fourth protection element Tc2' and having its source terminal coupled to the first supply voltage. Accordingly, the fifth protection element D2n'' corresponds to an n-channel diode having its conducting direction from the node between the third protection element D2p' and the fourth protection element Tc2' toward the first supply voltage. Its function in case of ESD events is therefore similar to the function of the second voltage setting diode D2n' of FIG. 3.

As compared to the illustrative embodiment of FIG. 3, it is not necessary that the diode of the fifth protection element D2n'' be sized so as to correspond to the bias transistor T2' of the current input stage. This is due to the fact that the voltage level in the node between the third protection element D2p' and the fourth protection element Tc2' is set by the buffer 490. In case of ESD events, the input of the buffer 490 is protected by the first ESD protection circuit 460 and the series resistor Rs. Otherwise, the operation in case of ESD events is as explained in connection with the illustrative embodiment of FIG. 3.

Also in the current input stage of FIG. 4, a voltage level in the node between the first protection element D1p' and the second protection element Tc1' of the first ESD protection circuit 460 and the voltage level in the node between the third protection element D2p' and the fourth protection element Tc2' of the second ESD protection circuit 480 are set to a value which corresponds to the voltage level at the signal input 420. Accordingly, the contribution of leakage currents through the second protection element Tc1' and the fourth protection element Tc2' is significantly reduced, thereby allowing the input current to be detected with high precision.

In the foregoing, illustrative embodiments of current input stages in integrated circuits have been described, in which leakage currents are reduced, thereby increasing the precision of current detection. Accordingly, it becomes possible to detect an input current of an integrated circuit, e.g. a sensor current, with high precision, even in case of very low input currents in the range of a few pA and below.

Various modifications are possible in the above described illustrative embodiments: For example, the above-mentioned sensors are not limited to a photo diode. In other illustrative embodiments, other types of sensors may be used. Also, the above-described concepts are not limited to sensing a sensor current, but may also be applied to other types of input current. For example, an input current may be sensed which forms a feedback signal in a control configuration, e.g. for controlling a piezo element or the like. Further, the implementation of the integrated circuits and their components is not limited to the illustrated type of components. For example, different types of transistors and diodes may be used, i.e. transistors having a different carrier type, different types of field effect transistors, or even bipolar transistors and diodes. Further, it is to be understood that the first supply voltage and the second supply voltage may be selected in a different manner, according to the specific requirements of application. The skilled person will understand how to modify carrier types of transistors and diodes so as to adopt the above-described illustrative embodiments to different relative configurations of the first supply voltage and the second supply voltage.

Finally, it is to be understood that in the illustrative embodiment of FIG. 1 the first ESD protection circuit and/or the second ESD protection circuit could be omitted. Further, in the illustrative embodiments of FIGS. 3 and 4, the second ESD protection circuit could be omitted. Also, it is possible to combine features of the above-mentioned illustrative embodiments with each other as appropriate.

What is claimed is:

1. An integrated circuit, comprising:
   a signal input, and
   a voltage setting circuit configured to set the voltage level at the signal input to a value corresponding to a first supply voltage of the integrated circuit, wherein the voltage setting circuit comprises:
      a first transistor arranged in a first current path through the signal input,
      a resistor arranged in a second current path from a second supply voltage to the first supply voltage, and
      a current mirror circuit configured to mirror the current through the first current path to the second current path,
      wherein a control terminal of the first transistor is coupled to a node between the second supply voltage and the resistor.

2. The integrated circuit according to claim 1, wherein the second current path comprises a diode coupled between the resistor and the first supply voltage.

3. The integrated circuit according to claim 2, wherein the voltage setting circuit comprises a bias current source coupled to a node between the resistor and the diode.

4. The integrated circuit according to claim 1, wherein the current mirror circuit is further configured to mirror the current in the first current path to a third current path.

5. The integrated circuit according to claim 1,
   wherein the first supply voltage is a low supply voltage of the integrated circuit.

6. An integrated circuit, comprising:
   a signal input,
   a voltage setting circuit configured to set the voltage level at the signal input to a value corresponding to a first supply voltage of the integrated circuit; and a first electrostatic discharge protection circuit coupled to the signal input, wherein the first electrostatic discharge protection circuit comprises:
   a first protection element and a second protection element coupled in series between a second supply voltage and the signal input,
   wherein a node between the first protection element and the second protection element is coupled to the first supply voltage.

7. The integrated circuit according to claim 6, comprising:
a second electrostatic discharge protection circuit coupled to the signal input and to the first electrostatic discharge protection circuit via a series resistor.

8. The integrated circuit according to claim 7,
wherein the second electrostatic discharge protection circuit comprises:
   a third protection element and a fourth protection element coupled in series between a second supply voltage and the signal input,
   wherein a node between the third protection element and the fourth protection element is coupled to the first supply voltage.

9. An integrated circuit
a sensor having a first terminal coupled to a first supply voltage of the integrated circuit, and a second terminal, and
a voltage setting circuit configured to set the voltage level at the second terminal to a value corresponding to the first supply voltage, wherein the voltage setting circuit comprises:
   a first transistor arranged in a first current path through the first terminal and the second terminal of the sensor,
   a resistor arranged in a second current path from a second supply voltage to the first supply voltage, and
   a current mirror circuit configured to mirror the current in the first current path to the second current path,
   wherein a control terminal of the first transistor is coupled to a node between the second supply voltage and the resistor.

10. The integrated circuit according to claim 9, wherein the second current path comprises a diode coupled between the resistor and the first supply voltage.

11. The integrated circuit according to claim 9, wherein the voltage setting circuit comprises a bias current source coupled to a node between the resistor and the diode.

12. The integrated circuit according to claim 9, wherein the current mirror circuit is further configured to mirror the current through the first current path to a third current path.

13. An integrated circuit, comprising:
a signal input, and
a first electrostatic discharge protection circuit coupled to the signal input, to a first supply voltage of the integrated circuit, and to a second supply voltage of the integrated circuit, wherein the first electrostatic discharge protection circuit comprises
   a first protection element and a second protection element coupled in series between the second supply voltage and the signal input, and
   a first voltage setting circuit coupled to a node between the first protection element and the second protection element and configured to set the voltage level at the node between the first protection element and the second protection element to a value corresponding to a voltage level at the signal input.

14. The integrated circuit according to claim 13, comprising:
a current input stage comprising a bias transistor and a bias current source coupled to a first terminal of the bias transistors so as to supply a bias current through the bias transistor,
   wherein a second terminal of the bias transistor is coupled to the first supply voltage,
   wherein a control terminal of the bias transistor is coupled to the signal input,
   wherein the first voltage setting circuit comprises a first voltage setting diode and a first current source coupled to a first terminal of the first voltage setting diode so as to supply a first current through the first voltage setting diode,
   wherein the first terminal of the first voltage setting diode is coupled to the node between the first protection element and the second protection element,
   wherein a second terminal of the first voltage setting diode is coupled to the first supply voltage,
   wherein the voltage setting diode is sized so as to correspond to the bias transistor, and
   wherein the first current source is configured to provide the first current substantially equal to the bias current.

15. The integrated circuit according to claim 13, comprising:
a second electrostatic discharge protection circuit coupled to the signal input and to the first electrostatic discharge protection circuit via a series resistor, and further coupled to the first supply voltage and to the second supply voltage,
   wherein the second electrostatic discharge protection circuit comprises a third protection element and a fourth protection element coupled in series between the second supply voltage and the signal input, and a second voltage setting circuit coupled to a node between the third protection element and the fourth protection element and configured to set the voltage level in the node between the third protection element and the fourth protection element to a value corresponding to the voltage level at the signal input.

16. The integrated circuit according to claim 15, comprising:
a current input stage comprising a bias transistor and a bias current source coupled to a first terminal of the bias transistors so as to supply a bias current trough the bias transistor,
   wherein a second terminal of the bias transistor is coupled to the first supply voltage,
   wherein a control terminal of the bias transistor is coupled to the signal input,
   wherein the first voltage setting circuit comprises a first voltage setting diode and a first current source coupled to a first terminal of the first voltage setting diode so as to supply a first current through the first voltage setting diode,
   wherein the first terminal of the first voltage setting diode is coupled to the node between the first protection element and the second protection element,
   wherein a second terminal of the first voltage setting diode is coupled to the first supply voltage,
   wherein the second voltage setting circuit comprises a second voltage setting diode and a second current source coupled to a first terminal of the second voltage setting diode so as to supply a second current through the second voltage setting diode, wherein the first terminal of the second voltage setting diode is coupled to the node between the third protection element and the fourth protection element, wherein a second terminal of the second voltage setting diode is coupled to the first supply voltage, wherein the first voltage setting diode and the second voltage setting diode are each sized so as to correspond to the bias transistor, and wherein the first current source and the second current source are configured to provide the first current and the second current substantially equal to the bias current.

17. The integrated circuit according to claim 15, comprising:

a current input state comprising a bias transistor and a bias current source coupled to a first terminal of the bias transistor so as to supply a bias current through the bias transistor, wherein a second terminal of the bias transistor is coupled to the first supply voltage, wherein a control terminal of the bias transistor is coupled to the signal input, wherein the first voltage setting circuit comprises a first voltage setting diode and a first current source coupled to a first terminal of the first voltage setting diode so as to supply a first current through the first voltage setting diode, wherein the first terminal of the first voltage setting diode is coupled to the node between the first protection element and the second protection element, wherein a second terminal of the first voltage setting diode is coupled to the first supply voltage, wherein the second voltage setting circuit comprises a buffer having an input coupled to the signal input via the series resistor and having an output coupled to the node between the third protection element and the fourth protection element, and a fifth protection element having a first terminal coupled to the node between the third protection element and the fourth protection element, and having a second terminal coupled to the first supply voltage, wherein the first voltage setting diode is sized so as to correspond to the bias transistor, and wherein the first current source is configured to provide the first current substantially equal to the bias current.

18. The integrated circuit according to claim 13, wherein the first supply voltage corresponds to a low supply voltage and the second supply voltage corresponds to a high supply voltage.

19. A method of sensing a current signal in an integrated circuit, comprising:

receiving the current signal in a measuring node corresponding to a signal input of the integrated circuit, setting a voltage level at the measuring node to a value corresponding to a first supply voltage of the integrated circuit;

forming an electrostatic discharge protection circuit coupled to the signal input, the first supply voltage and a second supply voltage, the electrostatic discharge protection circuit having a first protection element and a second protection element coupled in series between the second supply voltage and the signal input, and coupling a node between the first protection element and the second protection element to the first supply voltage.

20. A method of sensing a current signal in an integrated circuit, comprising:

receiving the current signal via a signal input, forming an electrostatic discharge protection circuit coupled to the signal input, to a first supply voltage of the integrated circuit and to a second supply voltage of the integrated circuit, with a first protection element and a second protection element coupled in series between the second supply voltage and the signal input, and setting a voltage level in a node between the first protection element and the second protection element to correspond to a voltage level at the signal input.

21. The method according to claim 20, comprising:

coupling the signal input to a current input stage, the current input stage comprising a bias transistor and a bias current source coupled to a first terminal of the bias transistor so as to supply a bias current through the bias transistor, a second terminal of the bias transistor being coupled to the first supply voltage and a control terminal of the bias transistor being coupled to the signal input, and forming the electrostatic discharge protection circuit with a voltage setting diode and a current source coupled to a first terminal of the voltage setting diode so as to supply a current through the voltage setting diode, the first terminal of the voltage setting diode being coupled to the node between the first protection element and the second protection element, and the second terminal of the voltage setting diode being coupled to the first supply voltage, sizing the voltage setting diode so as to correspond to the bias transistor, and supplying a current through the voltage setting diode which is substantially equal to the bias current.

* * * * *